(12) United States Patent
Stroessner et al.

(10) Patent No.: US 7,626,689 B2
(45) Date of Patent: Dec. 1, 2009

(54) METHOD AND DEVICE FOR ANALYSING THE IMAGING BEHAVIOR OF AN OPTICAL IMAGING ELEMENT

(75) Inventors: Ulrich Stroessner, Jena (DE); Joern Greif-Wuestenbecker, Vienna (AT)

(73) Assignee: Carl Zeiss SMS GmbH, Jena (DE)

( * ) Notice: Subject to any disclaimer, the term of this patent is extended or adjusted under 35 U.S.C. 154(b) by 0 days.

(21) Appl. No.: 12/158,403

(22) PCT Filed: Dec. 15, 2006

(86) PCT No.: PCT/EP2006/012103

§ 371 (c)(1),
(2), (4) Date: Jun. 20, 2008

(87) PCT Pub. No.: WO2007/079904

PCT Pub. Date: Jul. 19, 2007

(65) Prior Publication Data

US 2008/0297775 A1    Dec. 4, 2008

(30) Foreign Application Priority Data

Dec. 22, 2005    (DE)    ........................ 10 2005 062 237

(51) Int. Cl.
*G01B 9/00*    (2006.01)
*G01B 11/00*    (2006.01)

(52) U.S. Cl. ................... 356/124; 356/364; 382/255
(58) Field of Classification Search ......... 356/124–127, 356/364–369; 382/255, 100, 312, 321
See application file for complete search history.

(56) References Cited

U.S. PATENT DOCUMENTS

| 5,298,972 | A | 3/1994 | Heffner |
|---|---|---|---|
| 5,396,329 | A | 3/1995 | Kalawsky |
| 5,731,916 | A * | 3/1998 | Ono ........................... 359/793 |
| 5,828,500 | A | 10/1998 | Kida et al. |
| 6,266,141 | B1 | 7/2001 | Morita |
| 6,665,059 | B2 | 12/2003 | Kanno et al. |
| 6,693,704 | B1 * | 2/2004 | Ooki et al. .................. 356/121 |

(Continued)

FOREIGN PATENT DOCUMENTS

EP    1 615 062 A2    1/2006

(Continued)

*Primary Examiner*—Hoa Q Pham
(74) *Attorney, Agent, or Firm*—Patterson, Thuente, Skaar & Christensen, P.A.

(57) ABSTRACT

A method for analyzing the imaging behavior of a first optical imaging element, in which an object is imaged by a second optical imaging element and light in the image plane is detected in a spatially resolved manner. The two optical imaging elements differ in at least one imaging characteristic. Values are determined for intensity and at least one second characteristic and then stored in image points, and processed in an emulation step. An emulation image is produced, taking into account the influence of the second characteristic. A series of images is produced by dividing a range of values of the second characteristic into subdomains, associating an image with each subdomain, and associating the corresponding intensity value with the image points of each image, in case the value of the second characteristic, associated with the image point, falls in the subdomain associated with the respective image.

30 Claims, 2 Drawing Sheets

U.S. PATENT DOCUMENTS

| | | | |
|---|---|---|---|
| 7,277,182 B2 * | 10/2007 | Wegmann et al. | 356/494 |
| 7,286,284 B2 | 10/2007 | Totzeck et al. | |
| 7,307,707 B2 * | 12/2007 | Wegmann | 356/124 |
| 2004/0114150 A1 | 6/2004 | Wegmann et al. | |
| 2004/0174607 A1 | 9/2004 | Brunner et al. | |
| 2006/0001861 A1 * | 1/2006 | Wegmann | 356/124 |
| 2008/0252888 A1 * | 10/2008 | Wegmann et al. | 356/365 |

FOREIGN PATENT DOCUMENTS

| | | |
|---|---|---|
| WO | WO 03/001272 A2 | 1/2003 |
| WO | WO 03/076891 A2 | 9/2003 |

\* cited by examiner

METHOD AND DEVICE FOR ANALYSING THE IMAGING BEHAVIOR OF AN OPTICAL IMAGING ELEMENT

BACKGROUND OF THE INVENTION

The invention relates to a method for examining the imaging behavior of first imaging optics, wherein an object is imaged into an image plane by second imaging optics and light in the image plane is detected in pixels in a spatially resolved manner, wherein the first and second imaging optics differ in at least one imaging characteristic, wherein values for the intensity as a first characteristic of the light and for at least one further, second characteristic of the light are determined for each pixel and stored in pixels, and the stored values are processed in an emulation step and an emulation image is generated, which emulates an image of the object generated by the first imaging optics, taking into consideration the imaging characteristic and the influence of the second characteristic on the imaging behavior.

The invention also relates to an apparatus for examining the imaging behavior of first imaging optics. Such an apparatus comprises second imaging optics, by which an object is imaged into an image plane and which differ from the first imaging optics in at least one imaging characteristic; a spatially resolving detector with pixels, by which the light in the image plane is detected in the pixels; a memory module in which values for intensity, as a first characteristic of the light, and for at least one further, second characteristic of the light are stored in a spatially resolved manner in pixels; as well as an emulation module, in which the stored values are processed and an emulation image is generated, which emulates an object image generated by the first imaging optics, taking into consideration the imaging characteristic and the influence of the second characteristic on the imaging behavior. The invention relates to the problem that dependencies on the second characteristic—which may be, for example, color or polarization—can be taken into consideration in the prior art only incompletely, e.g. summarily, in an emulation.

During emulation of the imaging characteristics of optical systems, inaccuracies may appear in the emulation. Some errors become particularly evident, for example, when high-aperture imaging optics are emulated by low-aperture imaging optics. For example, polarizing elements, such as polarizers or gratings, have been examined and evaluated so far substantially with respect to their integral effect. However, with the development of micro- or nano-structured optical components, the determination of local optical characteristics is gaining more and more importance for the further development and improvement of manufacturing processes and for the assurance of product quality. As an example of such optical components, a diffractive optical element (DOE) of the type used, for example, in the hybrid objective described in WO 03/001272 A3 should be mentioned here. The optical effect of this DOE occurs at the webs which are concentrically arranged around the optical axis. In this case, the distance between two webs is not constant, but varies depending on the radius. The purpose of this element is a dispersively imaging color compensation within the objective, in which case the optical quality of the objective results from the cooperation between the refractive lenses and the DOE. In order to avoid not being able to judge the optical characteristics of the DOE until the final assembly of the objective, it is desirable to study the optical effect previously in detail. This can be effected independently of the objective, or by insertion into the beam path of imaging optics, e.g. an emulation imaging system as second imaging optics for emulation of the respective objective, the first imaging optics. The insertion of the DOE usually requires an adaptation of the beam path, because both imaging optics differ at least in that respect. Moreover, the second imaging optics may also be designed to image the object such that it is magnified or reduced in size with respect to the objective.

Other examples of such components are classic linear diffraction gratings. In the case of gratings used in telecommunications, for example, an increasing number of line pairs per unit of surface area leads to an increase in the energy proportion and, thus, in the efficiency in the zeroth order of diffraction. The polarizing effect in the grating increases with an increasing number of lines, i.e. smaller structural dimensions.

Polarization effects also play a more and more important role in photolithographic scanners in which there is a trend towards increasingly larger numerical apertures and increasingly smaller mask structures. However, the emulation imaging methods and systems known so far in the prior art allow only an incomplete description of such polarization effects, because the polarization effect is taken into consideration only summarily, i.e. integrated via the image area.

SUMMARY OF THE INVENTION

Therefore, it is an object of the present invention to improve a method and an apparatus of the above-mentioned type such that better consideration is given to optical characteristics and factors influencing the imaging behavior of first imaging optics to be examined.

In a method of the above-described type, this object is achieved in that a series of images is initially generated by (a) dividing a range of values of the second characteristic into partial ranges, (b) assigning an image to each partial range, and (c) assigning the to the pixels of each image the corresponding stored intensity value if the second characteristic's value assigned to the pixel falls within the partial range assigned to the respective image, and otherwise assigning a predetermined intensity value to said pixels. The series of images is then converted to a series of intermediate images in the emulation step, the emulation including a constant value of the second characteristic for each of the intermediate images. The constant value of the second characteristic originates from the respective partial range and differs from the values of the second characteristic for the respective other intermediate images. Next, the intermediate images are combined to form the emulation image.

When an image is generated using an optical component to be examined, not only the intensity but also a further characteristic, for example the color or the polarization effect, is determined for each pixel, for which purpose methods known from the prior art can be used. Just like the intensity, the value of the second characteristic will usually also vary depending on the location. The division into individual images for which the value of the second characteristic, which is included as a parameter in the evaluation method or the emulation step, respectively, is constant in each case, allows to reduce the error which would have been made as compared to an evaluation or emulation—as in the prior art—in which the value for the second characteristic is averaged over the entire image. The more partial ranges are formed and the narrower they are, the smaller will be the error.

The partial ranges may be selected such that they adjoin each other. However, for processing and practicability it is advantageous to select partial ranges with at least a partial overlap between them, and preferably only between adjacent partial ranges. A division into partial ranges may be achieved in this manner, for example, with the help of trigonometric functions—the transmission of a color filter or of a polarizer, for example, is described by the square of a sine function.

As the predetermined intensity value, 0 is preferably selected, i.e. as soon as the value of the second characteristic no longer falls within the partial range assigned to an intermediate image, the intensity value for said intermediate image and for the corresponding pixel is set to zero. In doing so, it is convenient if images, intermediate images and the emulation image each have the same size, because this will facilitate processing. Thus, each image, intermediate image and the emulation image preferably have the same number of pixels or pixel lines and pixel columns, respectively. It goes without saying that different sizes can also be used, if a corresponding adaptation is effected.

There are various possibilities of combining the intermediate images to form the emulation image. A particularly simple one consists in adding the intermediate images for each pixel. Another likewise easy to realize possibility consists in taking the average of the intermediate images' intensity values for each pixel and thus generating the emulation image.

It is advantageous, particularly where the partial ranges overlap, to weight the intensity values when assigning them to an image of the series. Said weighting is preferably effected such that the sum of the intensity values weighted for one pixel corresponds to the original intensity values of the pixel when they are assigned to several partial ranges.

Various characteristics of the light to be detected are suitable as a second characteristic, an important characteristic being the color, for example. In this case, the wavelength and/or the degree of color saturation is/are preferably determined and stored for each pixel. This can be achieved, for example, by independently detecting the colors in each pixel, e.g. by using a wavelength-selective detector with suitable precedingly arranged optics, said detector detecting each color range-red, green and blue—separately. Another possibility consists in generating the series of individual images with the help of color filters which are introduced into the beam path.

A particularly preferred choice for the second characteristic is the polarization condition which is gaining more influence, for example, in the emulation of large-aperture optics. Since the polarization condition, unlike the intensity, is not directly detectable on a CCD, the degree of polarization and/or the direction of polarization has/have to be determined by measurement and stored for each pixel. For spatially resolved determination of the polarization, the Stokes parameters characterizing the optical element can be determined, for example, in a spatially resolved manner. This method is described, for example, by H. W. Berry et al. in Applied Optics 16, 3200 (1977). Next, the series of images can be computer-generated on the basis of the stored values.

Another possibility consists in generating the series of images by guiding the light through a polarizer prior to detection, thus defining the partial ranges by the different positions of the polarizer. Such a polarizer already incorporates a natural weighting function which substantially corresponds to the square of a sine function. Therefore, the partial ranges are usually rather large and overlap. A combination of the polarizer and the computer generation of the images is also possible.

If the series of images is computer-generated on the basis of the stored values, this natural weighting function can also be used, but there is still a great number of usually more favorable weighting functions available. In an advantageous embodiment of the method, the intensity values are weighted, for example, using a function $$C \cdot |\phi - \theta|$$

if the angle of polarization $\theta$ assigned to a pixel falls within the partial range, with C being a constant and $\phi$ being the angle of polarization at the center of the corresponding partial range. If the angle of polarization assigned to a pixel is outside the partial range, the predetermined intensity value, for example zero, is assigned to a pixel. Using this triangular function whose inclination can be influenced by a suitable choice of the constant, weighting can be achieved such that a substantially homogeneous polarization can be assumed for each image. In this case, the greater the number of partial ranges is selected, the higher will be the precision. However, the number of partial ranges has to be adapted to the duration of emulation, because the emulation step takes longer as the number of images increases. For example, a selection of 6, 8 or 12 partial ranges has turned out to be a good compromise. In principle, the number of partial ranges is freely selectable. In order to allow better handling of the triangular function just described in the evaluation method or in the emulation step, respectively, it may also be folded, for example, with a smoothing function, so that it becomes continuously differentiable at least once.

Another possibility consists in weighting the intensity values having the function $$C \cdot \cos^2(\phi - \theta)$$

if the angle of polarization $\theta$ assigned to a pixel falls within the partial range, with C being a constant and $\phi$ being the angle of polarization at the center of the corresponding partial range. This function substantially corresponds to a rounded triangular function for an adapted selection of constants.

For the images of the series which have been generated with these functions, the polarization via the image field is approximately constant. The images may then be processed substantially without error in the evaluation method or in the emulation step, respectively, where a spatial dependence of polarization is not taken into account.

In a preferred embodiment of the invention, unpolarized light, which is to include also circularly polarized light, is also taken into consideration. This is achieved in that one of the partial ranges has only a degree of polarization of zero assigned to it and the image assigned to this partial range has the intensity values of detected, unpolarized light assigned to it. The intensity values assigned to the image having a degree of polarization of zero can then be allocated to other images and added to the corresponding intensity values. Said allocation is preferably effected uniformly. As an alternative, this image may also be processed separately, either in its entirety or by being in turn allocated to different images again.

In a particularly preferred embodiment of the invention, a photolithographic scanner is used as the first imaging optics and emulation imaging optics for emulation of the photolithographic scanner are used as the second imaging optics. The photolithographic scanner is constituted by imaging optics having a very large numerical aperture, whereas the emulation imaging optics are optics having a small numerical aperture. The above-described invention thus allows to emulate, in a spatially resolved manner, in the emulation step, e.g. methods for emulation of imaging-optical effects with large numerical apertures, as described in German patent application 10 2004 033 603.2, although the methods described therein do not take a spatial dependence of the polarization into consideration.

The invention also relates to an apparatus for examining the imaging behavior of first imaging optics. In such an apparatus, as described above, the object is achieved in that the apparatus generates a series of images by (a) dividing a range of values of the second characteristic into partial ranges, (b) assigning an image to each partial range, and (c) assigning to the pixels of each image the corresponding stored intensity value, if the second characteristic's value assigned to the pixel falls within the partial range assigned to the respective image, and otherwise assigning to said pixels a predetermined intensity value. The emulation module then converts the series of images into a series of intermediate images, the emulation including a constant value of the second characteristic for each of the intermediate images. The constant value of the second characteristic originates from the respective partial range and differs from the values of the second characteristic for the respective intermediate images. Next, the emulation module combines the intermediate images to form the emulation image. In this manner, the influence of the second characteristic on the imaging behavior can be taken into consideration in the emulation image in a spatially resolved manner.

The predetermined intensity value is preferably zero, which facilitates evaluation. It is also convenient if there is a partial overlap between the partial ranges, depending on what weighting function the apparatus uses.

The apparatus preferably generates a series of images and a series of intermediate images respectively having the same size, because this considerably simplifies handling and creates no difficulties allocating the intensity values to the images or intermediate images, respectively. Of course, a suitable adaptation also allows to use different image sizes. The apparatus preferably adds the intensity values of the intermediate images for each pixel and thus creates the emulation image. This is the easiest method of taking the spatial dependence of the second quantity or its variability over the image field, respectively, into consideration in the emulation image. As an alternative, the apparatus can also form the average of the intensity values of the intermediate images for each pixel and generate the emulation image in this manner. In doing so, the apparatus preferably weights the intensity values when assigning them to an image of the series, which is advantageous, in particular, if the partial ranges overlap and an intensity value can be assigned to several partial ranges.

In a preferred embodiment of the apparatus, the second characteristic is color, in which case the wavelength and/or the degree of color saturation are stored for each pixel in the memory module. This characteristic is relatively easy to detect with the help of modern detectors on a CCD or CMOS basis, in which case it may be envisaged, for example, to detect the color ranges of red, green and blue for each pixel individually by one CCD each with the help of corresponding optics.

However, color is not the only option for the second characteristic. Other characteristics, which need not necessarily be immediately visible, are also suitable. An important second characteristic, particularly with respect to the emulation of large-aperture imaging optics by small-aperture imaging optics, is the polarization condition. In this case, the degree of polarization and/or the direction of polarization for each pixel is/are stored in the memory module. The apparatus may be provided with a polarizer through which the light is guided before detection. The partial ranges are defined by different positions of the polarizer. In this way, the series of images can be generated directly. Another possibility consists in generating the series of images computationally, on the basis of the stored values. In this case, the degree of polarization and/or the direction of polarization for each pixel is/are stored at the beginning. Even a combination of the polarizer and of the computational evaluation is possible. Moreover, the apparatus preferably assigns to one of the partial ranges exclusively a degree of polarization which is zero. The image assigned to this partial range then has the intensity values of detected, unpolarized light assigned to it.

In a particularly preferred embodiment of the invention, the apparatus is provided with first imaging optics in the form of a photolithographic scanner and with second imaging optics in the form of emulation imaging optics for emulation of the photolithographic scanner. This allows the polarization characteristics of the photolithographic scanner to be emulated by the emulation imaging optics in a spatially resolved manner, although the emulation method providing the basis and implemented in the emulation module cannot take this spatial dependence into consideration.

The invention will be explained in more detail below with reference to an exemplary embodiment.

BRIEF DESCRIPTION OF THE DRAWINGS

In the respective drawings.

DETAILED DESCRIPTION

Figure 1:
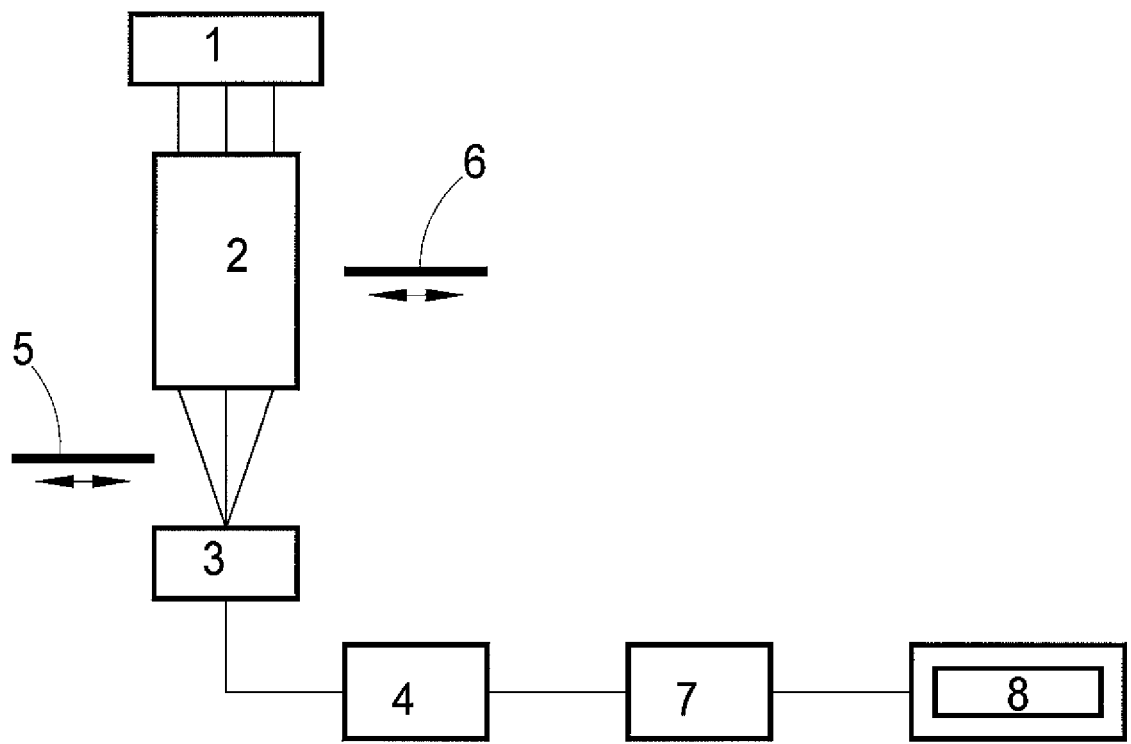
FIG. 1 shows an exemplary apparatus and
FIG. 2 shows the sequence of the methods.

FIG. 1 shows an apparatus of the type which can be used to examine the imaging behavior of first imaging optics which are not shown. Light from a light source 1 is supplied to second imaging optics 2. The second imaging optics 2 focus the light onto a spatially resolving detector 3 with pixels. The light is detected in the image plane in the pixels. Intensity is detected directly in the pixels. The values of intensity are stored, assigned to the pixels, in a memory module 4. Moreover, a second characteristic of the light is also stored in the memory module 4. This may be the color or the polarization of the light. In the latter case, there may be provided, for example, a rotatable polarizer 5 which can be slid into the beam path and arranged preceding the detector. The second imaging optics 2 image an object 6 onto the detector 3. For this purpose, the object 6 is inserted into the second imaging optics 2 at a suitable location, so that an image of the object 6 is generated on the detector 3. The object 6 may be, for example, a simple or nonlinear color filter, a polarizer or a diffractive optical element. In the latter case, the setting of the second imaging optics may have to be adapted to the imaging characteristics of the object 6. Finally, the object 6 may also be a mask of the type used in photolithography. In this case, the light source 1 is preferably a source emitting only one wavelength. If the second characteristic to be registered consists in the polarization or in characteristics not directly visible, further devices will be required, which are not shown here and serve to detect and determine these characteristics. The values of these characteristics are then also stored in a form assigned to the pixels in the memory module 4.

The stored values for intensity and for the second characteristic, e.g. polarization, are then processed by an emulation module 7. In the emulation module 7, an emulation image is generated which is displayed on a screen 8. In addition, the image may also be stored or/and printed.

Figure 2:
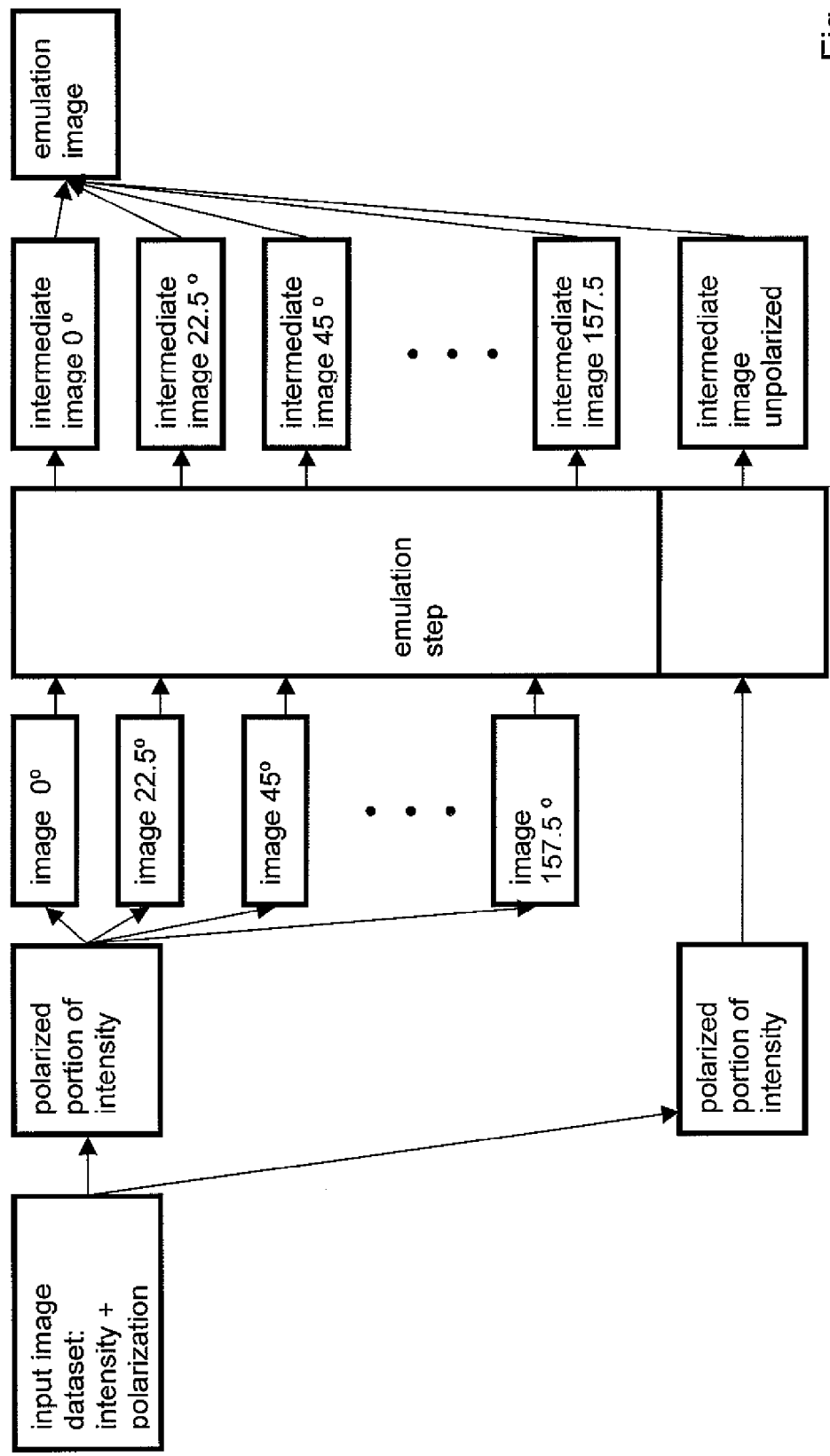

FIG. 2 schematically shows how the emulation image is generated. Intensity and polarization, i.e. the degree of polarization and/or the direction of polarization, are stored for each pixel. These data form the so-called input image dataset. A series of images is generated on the basis of this input image dataset. In doing so, the minimum and the maximum of the second characteristic can be determined first so as to define the range of values of this characteristic. This range of values is then decomposed into partial ranges, in which case the unpolarized portion of the intensity is assigned to a separate partial range having a degree of polarization of zero in the example. This partial range also contains the intensity values of the circularly polarized portion of the light. Of course, the assignment of said portion to its own partial range is not mandatory. For example, the unpolarized portion may also be divided up among the other partial ranges—this corresponds to a uniform division among the individual images. The further partial ranges are divided up according to angles of polarization within a range of values from 0° to 180°. In the present example, the angle of polarization φ at the center of the corresponding partial range is indicated for each image. The partial ranges may be selected such that they overlap or do not overlap according to the weighting function to be used. In the present example, eight partial ranges are selected. The images are subsequently processed in the emulation step. In doing so, an image of the object 6 is emulated by the first imaging optics, taking into consideration the imaging characteristic and the influence of polarization on the imaging behavior. The unpolarized intensity can be treated separately, but this is not a must. For example, it is also possible to divide it up among the polarized images. If the object 6 is a mask, for example, an image of this mask can be emulated using a photolithographic scanner as the first imaging optics. In this case, the second imaging optics 2 are emulation imaging optics. The imaging characteristics in which both optics differ are magnification and numerical aperture. During processing in the emulation step, intermediate images are generated for each angle of polarization φ. The polarization was assumed to be constant for the respective image in the emulation step. This has technical reasons, because the methods for emulation or for taking the polarization into consideration which are available in the prior art can only take constant polarizations into account. Finally, in the present example, the intermediate images are added to the emulation image pixel by pixel. In this manner, the spatial dependence can be taken into account in the polarization when emulating a photolithographic scanner, although the available prior art emulation method actually does not permit this or leads to greater errors, respectively.

LIST OF REFERENCE SYMBOLS 1 light source
2 second imaging optics
3 detector
4 memory module
5 polarizer
6 object
7 emulation module
8 screen

The invention claimed is:

1. A method for examining the imaging behavior of first imaging optics, wherein an object is imaged in an image plane by second imaging optics and light in the image plane is detected in pixels in a spatially resolved manner, wherein the first and second imaging optics differ in at least one imaging characteristic, the method comprising:

determining and storing for each pixel value intensity as a first characteristic of the light and at least one further, second characteristic of the light, and processing the stored values in an emulation step and generating an emulation image, which emulates an image of the object generated by the first imaging optics, taking into consideration the imaging characteristic and the influence of the second characteristic on the imaging behavior, generating a series of images by dividing a range of values of the second characteristic into partial ranges, assigning to each partial range an image, and assigning to the pixels of each image the corresponding stored intensity value, if the second characteristic's value assigned to the pixel falls within the partial range assigned to the respective image, and otherwise assigning a predetermined intensity value to said pixels, converting the series of images to a series of intermediate images in the emulation step, the emulation including a constant value of the second characteristic for each of the intermediate images, said value originating from the respective partial range and differing from the values of the second characteristic for the respective other intermediate images, and combining the intermediate images to form the emulation image.

2. The method as claimed in claim 1, wherein there is a partial overlap between the partial ranges.

3. The method as claimed in claim 1, wherein the predetermined intensity value is about zero.

4. The method as claimed in claim 1, wherein both the images and the intermediate images, respectively, have the same size.

5. The method as claimed in claim 4, further comprising adding the intensity values of the intermediate images for each pixel, and thus generating the emulation image.

6. The method as claimed in claim 4, further comprising determining the average of the intermediate images' intensity values for each pixel, and thus generating the emulation image.

7. The method as claimed in claim 1, further comprising weighting the intensity values when assigning them to an image of the series.

8. The method as claimed in claim 1, wherein the second characteristic is a polarization condition, and further comprising storing for each pixel the degree of polarization and/or the polarization direction as a stored value.

9. The method as claimed in claim 8, further comprising generating the series of images by passing the light though a polarizer prior to detection, the partial ranges being defined by different positions of the polarizer.

10. The method as claimed in claim 8, further comprising computationally generating the series of images on the basis of the stored values.

11. The method as claimed in claim 10, further comprising weighting the intensity values using a function $$C \cdot |\phi - \theta|$$

if the angle of polarization θ assigned to a pixel falls within the partial range, wherein C is a constant and φ represents an angle of polarization at the center of the corresponding partial range.

12. The method as claimed in claim 10, further comprising weighting the intensity values using a function $$C \cdot \cos^2(\phi - \theta)$$

if the angle of polarization θ assigned to a pixel falls within the partial range, wherein C is a constant and φ represents an angle of polarization at the center of the corresponding partial range.

13. The method as claimed in claim 8, further comprising assigning a degree of polarization of zero to one of the partial ranges exclusively, and assigning the intensity values of detected, unpolarized light to the image assigned to this partial range.

14. The method as claimed in claim 13, further comprising allocating the intensity values assigned to the image having a degree of polarization of zero to other images and adding the intensity values assigned to the image having a degree of polarization of zero to the corresponding intensity values.

15. The method as claimed in claim 14, further comprising effecting said allocation in a uniform manner.

16. The method as claimed in claim 1, wherein the second characteristic is color and further comprising storing for each pixel the wavelength and/or the degree of color saturation.

17. The method as claimed in claim 1, further comprising using a photolithographic scanner as the first imaging optics and using emulation imaging optics for emulation of the photolithographic scanner as the second imaging optics.

18. An apparatus for examining the imaging behavior of first imaging optics, said apparatus comprising:
    second imaging optics by which an object is imaged into an image plane and which differs from the first imaging optics in at least one imaging characteristic;
    a spatially resolving detector with pixels, by which detector light in the image plane is detected in the pixels;
    a memory module, in which values for intensity, as a first characteristic of the light, and for at least one further, second characteristic of the light are stored in a spatially resolved manner in the pixels; and
    an emulation module, in which the stored values are processed and an emulation image is generated, which emulates an image of an object generated by the first imaging optics, taking into consideration the imaging characteristic and the influence of the second characteristic on the imaging behavior,
    wherein the apparatus generates a series of images by dividing a range of values of the second characteristic into partial ranges,
    assigning an image to each partial range, and
    assigning to the pixels of each image the corresponding stored intensity value, if the second characteristic's value assigned to the pixel falls within the partial range assigned to the respective image, and otherwise assigning to said pixels a predetermined intensity value,
    further wherein the emulation module converts the series of images into a series of intermediate images, the emulation including a constant value of the second characteristic for each of the intermediate images, which value of the second characteristic originates from the respective partial range and differs from the values of the second characteristic for the respective other intermediate images, and
    the emulation module combines the intermediate images to form the emulation image.

19. The apparatus as claimed in claim 18, wherein there is a partial overlap between the partial ranges.

20. The apparatus according to claim 18, wherein the predetermined intensity value is about zero.

21. The apparatus as claimed in claim 18, wherein the apparatus generates a series of images and a series of intermediate images respectively having the same size.

22. The apparatus as claimed in claim 18, wherein the apparatus adds the intensity values of the intermediate images for each pixel and thus generates the emulation image.

23. The apparatus as claimed in claim 18, wherein the apparatus takes the average of the intermediate images' intensity values for each pixel and thus generates the emulation image.

24. The apparatus as claimed in claim 18, wherein the apparatus weights the intensity values when assigning them to an image of the series.

25. The apparatus as claimed in claim 18, wherein the second characteristic is a degree of polarization, and for each pixel the degree of polarization and/or a polarization direction are stored in the memory module.

26. The apparatus as claimed in claim 25, further comprising a polarizer through which the light is passed prior to detection, with the partial ranges being defined by different positions of the polarizer.

27. The apparatus as claimed in claim 25, wherein the apparatus generates the series of images computationally, on the basis of the stored values.

28. The apparatus as claimed in claim 25, wherein the apparatus assigns to one of the partial ranges exclusively a degree of polarization of zero and assigns to the image assigned to this partial range the intensity values of detected, unpolarized light.

29. The apparatus as claimed in claim 18, wherein the second characteristic is color, there being stored in the memory module the wavelength and/or the color saturation for each pixel.

30. The apparatus as claimed in claim 18, wherein the first imaging optics comprises a photolithographic scanner and wherein the second imaging optics comprises emulation imaging optics for emulation of the photolithographic scanner.

* * * * *